United States Patent
Falicoff et al.

(10) Patent No.: US 8,354,779 B2
(45) Date of Patent: Jan. 15, 2013

(54) HEAT SINK WITH HELICAL FINS AND ELECTROSTATIC AUGMENTATION

(75) Inventors: Waqidi Falicoff, Stevenson Ranch, CA (US); Yupin Sun, Yorba Linda, CA (US); William A. Parkyn, Lomita, CA (US)

(73) Assignee: Light Prescriptions Innovators LLC, Altadena, CA (US)

( * ) Notice: Subject to any disclaimer, the term of this patent is extended or adjusted under 35 U.S.C. 154(b) by 285 days.

(21) Appl. No.: 12/687,620

(22) Filed: Jan. 14, 2010

(65) Prior Publication Data

US 2010/0181889 A1    Jul. 22, 2010

Related U.S. Application Data

(60) Provisional application No. 61/205,390, filed on Jan. 16, 2009.

(51) Int. Cl.
*H01L 33/64* (2010.01)
*H01J 7/24* (2006.01)
*H01J 7/26* (2006.01)

(52) U.S. Cl. ............... 313/35; 313/44; 313/46; 362/294; 362/373; 362/264; 165/80.3; 165/182; 165/184; 165/185

(58) Field of Classification Search ............... 313/17–28, 313/35, 36, 44–46; 165/80.2, 80.3, 177–185; 362/294, 373, 264

See application file for complete search history.

(56) References Cited

U.S. PATENT DOCUMENTS

| | | | | |
|---|---|---|---|---|
| 6,561,261 | B2 * | 5/2003 | Wagner | 165/80.3 |
| 6,712,128 | B1 | 3/2004 | Dussinger et al. | 165/80.3 |
| 6,886,627 | B2 * | 5/2005 | Kozyra et al. | 165/80.3 |
| 7,153,004 | B2 * | 12/2006 | Galli | 362/373 |
| 2007/0023163 | A1 * | 2/2007 | Kidwell et al. | 165/45 |
| 2010/0085765 | A1 * | 4/2010 | Wang | 362/365 |
| 2010/0289395 | A1 * | 11/2010 | Sun et al. | 313/45 |

FOREIGN PATENT DOCUMENTS

| | | |
|---|---|---|
| EP | 866265 A2 * | 9/1998 |
| JP | 2000-035614 A | 2/2000 |
| KR | 10-2007-0116331 | 12/2007 |

* cited by examiner

*Primary Examiner* — Mariceli Santiago
(74) *Attorney, Agent, or Firm* — Brinker Biddle & Reath LLP

(57) ABSTRACT

A heat sink for an LED downlight utilizes tilted fins forming helical air passages that can enhance thermal performance by 30% over conventional fins. To overcome the thermal challenge of installation within the stagnant hot air of insulated ceiling cans, a heat sink has an integral electrostatic air pump on its exterior, to move hot air downwards and drain the stagnant air from the can by establishing a chimney-like circulation up through the heat sink and back down around the outside of the heat sink. The air mover can be powered by a compact high-voltage, low-current power supply similar to those of neon signs. An embodiment of the heat sink is also revealed that is suitable for cooling an LED replacement for standard screw-in or equivalent light bulbs. This device can perform well in variety of orientations (horizontal, vertical, etc.) and fixtures.

18 Claims, 7 Drawing Sheets

US 8,354,779 B2

HEAT SINK WITH HELICAL FINS AND ELECTROSTATIC AUGMENTATION

CROSS REFERENCE TO RELATED APPLICATIONS

This application claims benefit of U.S. Provisional Patent Application No. 61/205,390 by Falicoff and Sun, filed Jan. 16, 2009.

This application makes reference to U.S. patent application Ser. No. 12/456,392 (published on Dec. 31, 2009 as US 2009-0323338 A1) and the corresponding International Patent Application No. PCT/US09/03593, both filed Jun. 15, 2009, titled "Multi-Reflector Cylindrical Light Source with Interior LEDs and Exterior Heat Sink", which are incorporated herein by reference in their entirety.

BACKGROUND OF THE INVENTION

Heat sinks of the prior art use a variety of fin shapes for natural convection of heat to a cooling fluid, typically ambient air. The air passages formed by the fins are usually either rectangular or cylindrical, although there are also heat sinks with pins instead of fins. Finite-element computation packages can accurately predict thermal performance for heat sinks in a far wider variety of conditions than could ever be covered by actual testing. Although mostly mounted in specified orientations, most heat sinks would be expected to function adequately when oriented otherwise.

There is one situation, however, where heat sinks have been found wanting, namely when attempting to cool electronic equipment within a hot, sometimes insulated compartment. Such is the case with light-emitting diode (LED) downlights. Incandescent light bulbs are less temperature-sensitive than the LEDs seeking to replace them in downlights. Currently, the maximum long-term operating junction temperature of commercially available LEDs is approximately 175° C. (Nichia of Japan). Such temperatures, however, significantly degrade efficacy. A junction temperature near ordinary room temperature typically achieves the highest efficiency, but anything at or less than 60° C. suffices. Thus an ambient temperature of 25° C. requires an LED downlight's thermal management system to achieve a 35° C. temperature delta. Some active LED cooling systems are available on the market that can achieve this. Nuventix of Texas markets products for this purpose under the name Synjet, but costs are very high (in some cases more than the price of an LED downlight). Also, these units have moving parts, which can potentially break down with time, and require significant operating power. For example their product for cooling an LED PAR 38 lamp requires 1.5 watts of power. Finally, the bulk, geometry, and configuration of this company's products severely limit their use.

Downlights in general are mounted inside a downward-facing ceiling-can, with a 6" (15 cm) diameter being most common. Most commercial cans are open at the bottom but sealed laterally, and surrounded by ceiling insulation at that. Thus, hot air is trapped in them, a condition that prevents conventional heat sinks from being cooled by ambient air. A heat sink for LEDs that is adequate in ambient air will not work once the stagnant air in the can gets significantly above ambient, something that occurs when only a few Watts of waste heat are sent into an insulated can that is open only downwards. The majority of current commercial downlights typically contain 75-250 W incandescent lamps, corresponding to LED power levels of about 15-50 Watts electrical power consumption. About three quarters of the total electrical power, roughly between 10 and 40 Watts, is typically dissipated as heat within the can. The low-Watt limit on heat dissipation is thus a practical problem. Although cold-cathode fluorescent (CCF) lamps will also reduce power consumption and last longer, their relatively large size makes them optically inefficient within most cans. The hot air within a can will reduce the lifetime of CCF lamps as well.

LED downlights should out-compete compact fluorescent lamps, due to their compactness, ruggedness, and greater optical efficiency, except that the low-Watt limitation imposed by the can's insulation will greatly limit market penetration. Some companies have resorted to active means such as fans that bring ambient-temperature air to the heat sink of their LED downlights. What are needed are ways to move hot air out of the can without an apparatus of moving parts, with the attendant issues of cost, reliability, and noise.

Beyond LED downlights, LED light bulbs will need heat sinks that operate both horizontally and vertically, either within an envelope or externally. The development of LED light bulbs that are plug-compatible with existing incandescent lamps (such as the A19 lamps) has been hampered due to the limitations of existing thermal cooling technologies. Currently, system wattage is limited to between 2 and at most 5 Watts total system power. Given that the current system efficiency of high color rendition index (CRI) warm white LEDs is around 60 lumens per Watt, this limits the flux of these lamps to less than 300 lumens, only the output of a standard 25 W lamp. This figure is only achievable under ideal conditions, when the room temperature is 25° C. and the lamp is installed in a relatively open air light fixture. In worse (i.e., hotter) conditions the maximum practical output of today's LED light bulbs is closer to 200 lumens, severely limiting their market penetration.

SUMMARY OF THE INVENTION

The heat-sink geometry of the present application makes it possible to offer better heat removal than conventional configurations, at any orientation, and therefore provides a way, for the first time, of producing solid state lamps that can replace a wide range of incandescent bulbs.

The vane-like blades of the compressors of jet engines are of course tilted from the engine axis so their rotation about the axis results in axial air flow. This arrangement can usefully be employed in a heat sink as well, with tilted fins that form helical passages for the rising air they warm. The resulting helical passages assist cyclonic chimney effects because they send the air outwards as well as upward. This can result in a 30% performance improvement over the abovementioned conventional fins, when the axis of the helix is vertically oriented. Thermal simulations using the software package COSMOS confirmed that the new approach can outperform vertical fins for a given size heat-exchanger surface area. In one case a 10W LED downlight was modeled with either vertical fins or the helical vanes of the current application. Both had approximately the same heat-exchange surface area (54482 mm$^2$ for the helical fin system and 61767 mm$^2$ for the vertical fins). In this comparison 7 W of heat were generated by the 10 W LED downlight (including losses from the drivers). The new system ran 11° C. cooler than the conventional vertical fins.

Because of the stagnant air layer that forms inside a ceiling can, even this improvement may fall short at even higher power levels, because in order to establish a chimney effect the heat sink must remain at a higher temperature than the air at the top of the can. Thus a further preferred embodiment also utilizes an ionic air mover to push air downwards through an outer passage separate from the passages of the helical heat sink. Even a very low-velocity air mover can greatly enhance heat-sink performance over that of natural convection unaided. A further 25° C. temperature drop was obtained from a tenth-meter per second downward air current, or under a quarter mile per hour, a barely perceptible breeze that will be unnoticeable beyond the can. (In fact, the Ionic Breeze® air cleaner achieves ten times this velocity, as measured by the inventors.) The hybrid system was able to maintain an LED junction temperature of just 50° C. (25° C. above the ambient temperature of the room, which is assumed to be 25° C.). By comparison the junction temperature using the prior art vertical fins was 90° C., forty degrees hotter and definitely life-shortening. Overall, the new hybrid system dropped the junction temperature by 36° C. in the 10 Watt LED downlight, a very significant improvement.

While there are numerous methods of air-moving, those that involve moving parts will find difficulty in operating all the way around the periphery of the helical heat sink, with multiple small air movers being required, greatly increasing cost and complexity. The method utilized herein, however, has no moving parts and can cover inconvenient shapes of air-passages (such as an annular cylinder). Electrostatic, or ionic, air-moving utilizes high-voltage electrodes that produce an ion current entraining ambient air. Ionic entrainment is interestingly different from the usual source of air movement, differential pressure, in that it is a volume force due to an ionic current following an electric field acting independently upon every nano-parcel of air between the two electrodes generating it. Differential pressure, however, such as that produced by fans, is a surface force, so that each nano-parcel only feels force from its neighbors. As a result an ion-entrained flow mathematically differs somewhat from the usual pressurized flow, with thinner boundary layers at nearby surfaces.

Most importantly for the present application, moreover, is that the entrained flow can force hot air to move downward against gravity. This can keep the heat sink nearer ambient temperature. Conventional neon-sign technology can supply small enough power supplies for this function, in the 5-10 kV range. Less than a tenth of a Watt can generate the aforementioned current of a tenth meter per second, many times more thermally effective than natural convection. It was determined that the force for the electrostatic air-moving system only needed to be very small to induce excellent air flow in the system. That is, the combination of an upward thermal stack and a downward flow from electro-static air movement work together in a synergetic manner, the combined effect is greater than the sum of the parts. For example, simulations in COSMOS showed that the junction temperature of the LEDs of 62° C. could be achieved for the same hybrid system mentioned above if the air flow from the electro-static component is reduced to only 0.050 m/s (approximately one tenth of a mile per hour, only one-twentieth the air flow speed of conventional ionic air cleaners).

BRIEF DESCRIPTION OF THE DRAWINGS

The above and other aspects, features and advantages of the present invention will be apparent from the following more particular description of embodiments thereof, presented in conjunction with the following drawings wherein.

DETAILED DESCRIPTION OF THE PREFERRED EMBODIMENTS

A better understanding of various features and advantages of the present invention will be obtained by reference to the following detailed description and accompanying drawings, which set forth illustrative embodiments in which certain of the principles of the invention are utilized.

Figure 1A:
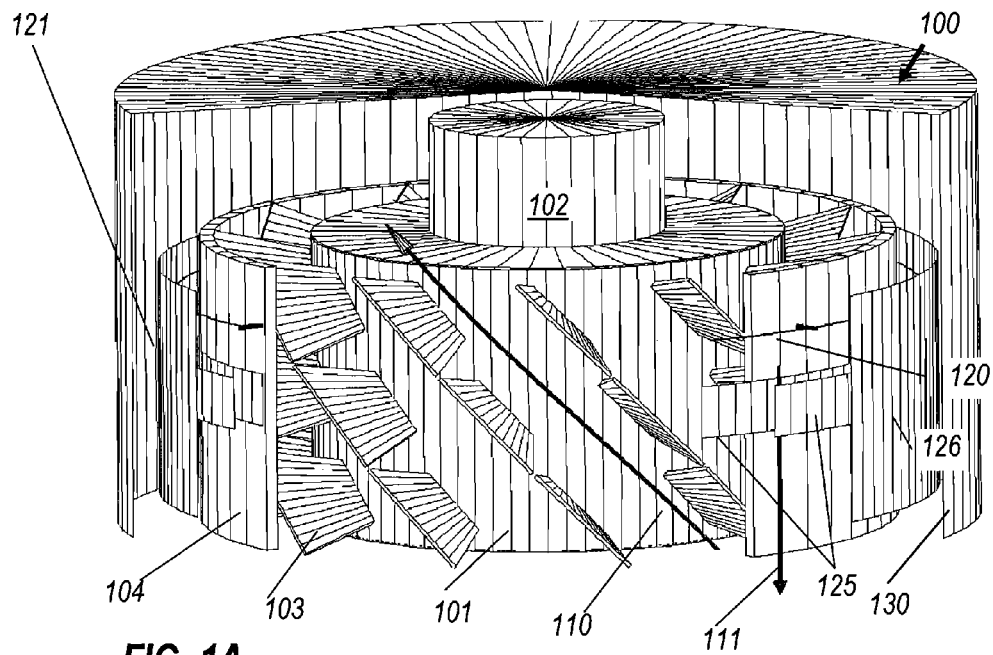
FIG. 1A is a cutaway view from above and to one side of one embodiment of a helical heat sink vertically oriented within a downlight can.
Figure 1B:
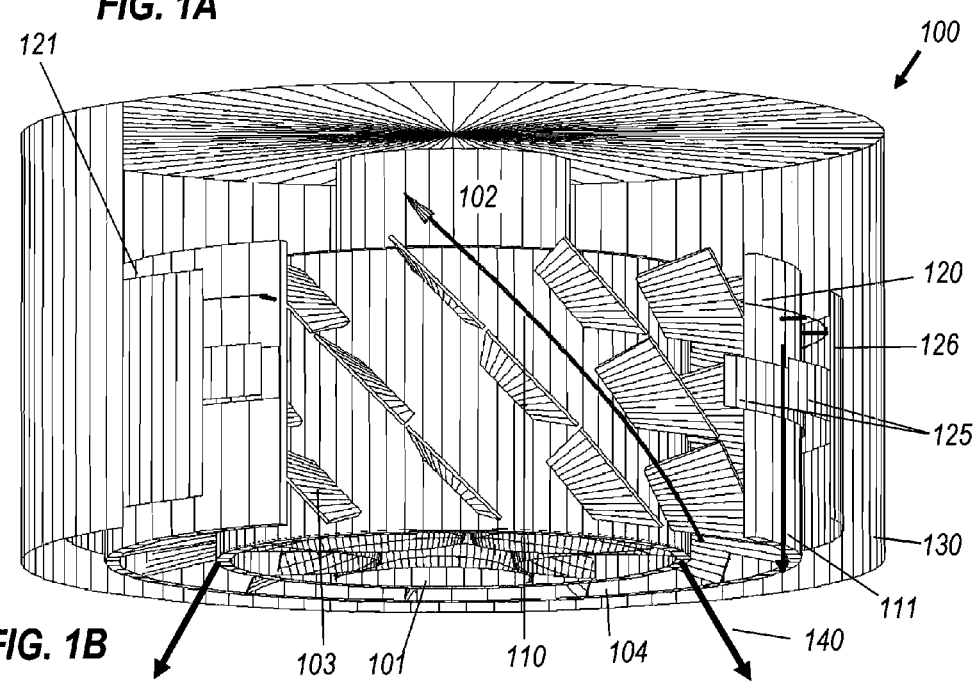
FIG. 1B is a cutaway view from below and to one side of the heat sink in can shown in FIG. 1A.
Figure 1C:
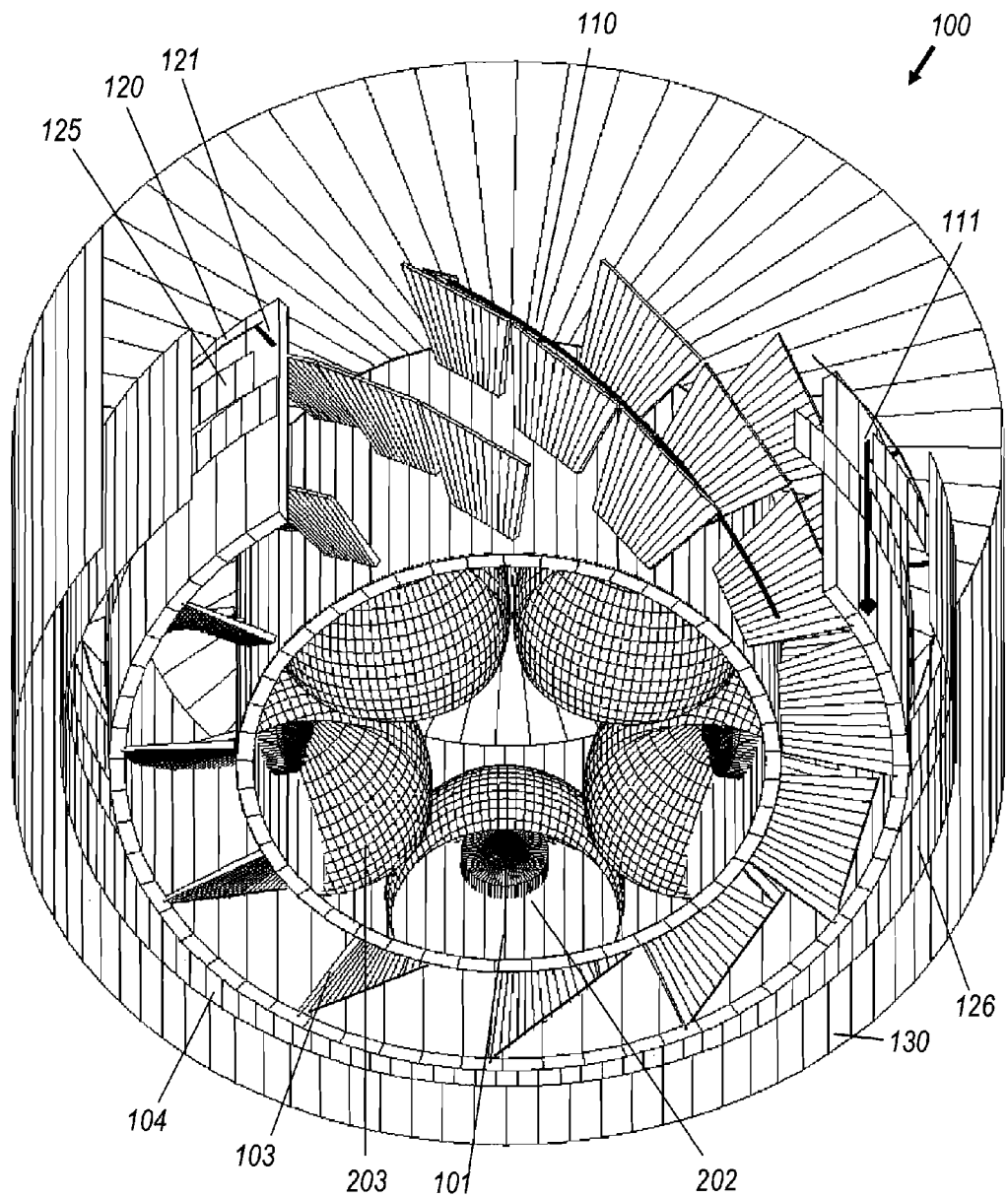
FIG. 1C is a cutaway view from further below of the heat sink in can shown in FIG. 1B.

FIG. 1A (which together with FIG. 1B and FIG. 1C may be collectively referred to as FIG. 1) shows a perspective cutaway view from above of LED downlight 100, comprising an inner sleeve that constitutes the wall of a central optical can 101. LEDs 202 and reflectors 203 (see FIG. 1C) are mounted to the inside walls of optical can 101. Downlight 100 further comprises power supply 102, vanes or fins 103, outer sleeve 104, and an outermost sleeve or shroud 126 outside outer sleeve 104, and is positioned within ceiling can 130. As shown in FIG. 1, there are three tiers of vanes 103. The individual vanes are tilted relative to the axial and circumferential directions of the can 101 and sleeves 104, 126. Three vanes 103 are aligned to form a generally helical surface extending the entire axial length of the can 101 and outer sleeve 104. The individual vanes 103 may be, but as explained below are not necessarily, curved to form a perfectly helical surface. However, in the interests of conciseness, the vanes 103, and similar fins or vanes in other embodiments, are referred to as "helical vanes." Ceiling can 130 is open only at the bottom. Optical can 101 includes thermal vias that transfer heat from the LEDs to helical vanes 103.

Thin-wire emitting electrode 120 surrounds the top of outer sleeve 104, while dual cylindrical collector electrodes 125 are mounted at the middle of outer sleeve 104, in the gap between outer sleeve 104 and shroud 126. Emitting electrode 120 is supported and spaced from sleeve 104 by supports 121, which enclose a feed-wire from a high-voltage module (not shown in detail) of LED power supply 102. Emitting electrode 120 comprises a ring of high-voltage wire, in a narrow 90-micron gauge to enhance its electric field and facilitate ionic breakdown of a corona in the ambient air. Emitting wire electrode 120 is a cathode giving off electrons and negative ions, while collector electrodes 125 are the anode. In order to prevent ionic leakage to ground, the inner surface of outermost shroud 126 and the outer surface of outer sleeve 104 are non-conductive. On metal surfaces this can be brought about by a suitable polymeric coating. Alternatively, the heat sink can be constructed of an electrically insulative but highly thermally conductive metal-impregnated ceramic, such as are supplied by the Ceramtech Corporation.

In an embodiment, the outer sleeve 104 and the shroud 126 are approximately 20 mm apart. The cylindrical collector electrodes 125 are approximately 10 mm apart. The cathode wire 120 is centered above the gap between the collector anodes 125, and is approximately 10 mm above the tops of the anodes.

Slanted arrows 110 indicate the path of rising air as it is heated by helical vanes 103. Down-pointing vertical arrows 111 indicate the path of sinking air pulled down by the attraction of anodes 125. This cyclonic chimney effect is important to continually replace air within the can with ambient air from below. The efficiency of this helical configuration is key to this chimney effect keeping temperatures well below still-air values, with only minimal power expenditure for the ionic air-mover.

Figure 3:
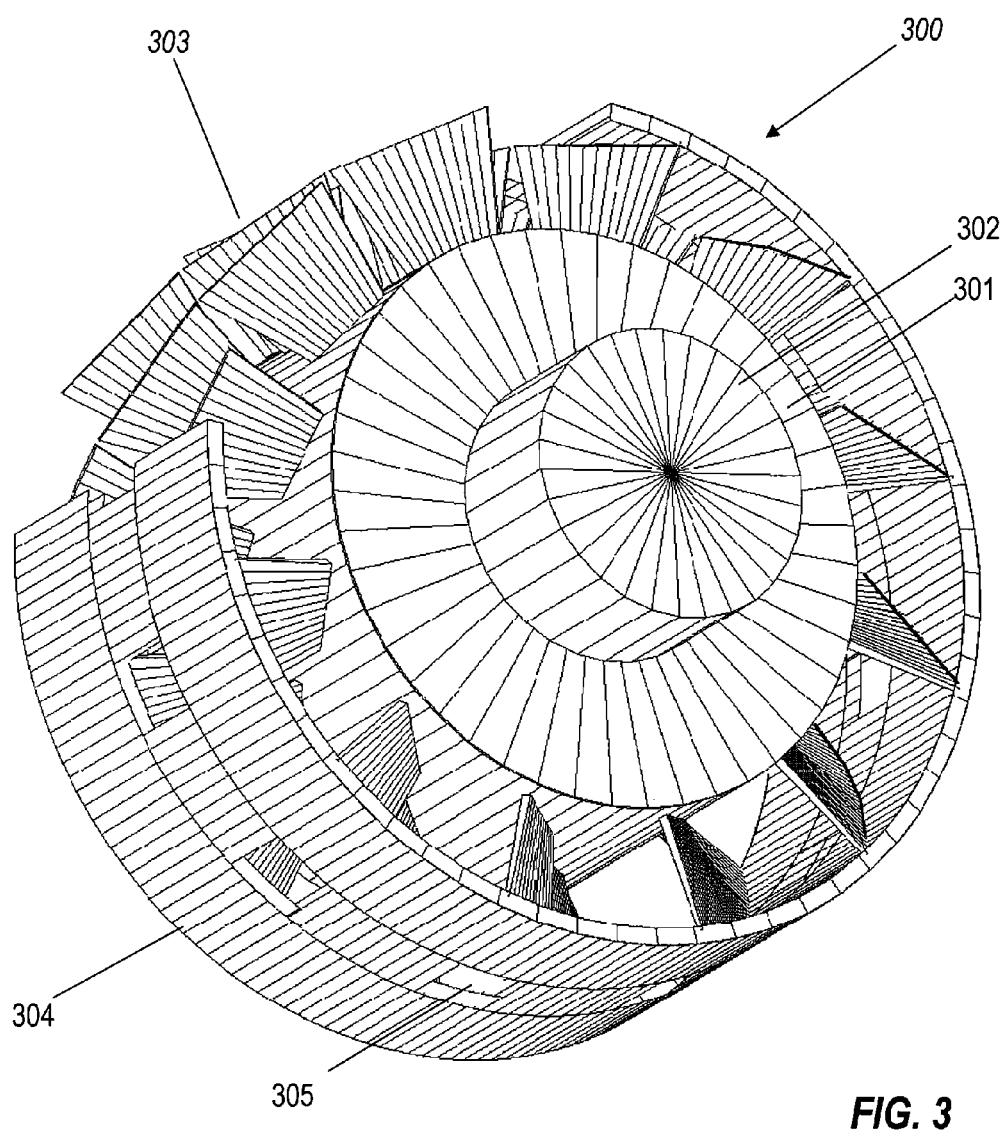
FIG. 3 shows a second embodiment of a helical heat sink suitable for use in arbitrary orientations.

This air flow would be relatively slow if pushed only by the rising air of arrow 110, so that the thermal performance of helical vanes 103 would be greatly enhanced by energizing the downward flow, indicated by vertical arrow 111. The vanes 103 are arranged in helical rows, forming between them the helical passages along which air rises as shown by arrows 110. However, the helical vanes 103 forming each row do not join edge to edge, leaving gaps between them that connect adjacent air passages. As shown in FIG. 1, the vanes 103 are wider at the tip (closest to the outer sleeve 104) than at the root (attached to the inner sleeve 101). The tips of adjacent vanes 103 touch, or almost touch, but the gaps are wider at the roots. The gaps between the vanes actually gave better thermal performance than closed passages, and were found to be highly beneficial for effectiveness when the entire heat sink is oriented horizontally, as shown in FIG. 3, rather than vertically, as in FIG. 1A. A tilt for the vanes of approximately 45° relative to the top plane of ceiling can 130 was found to provide good performance. Other tilt angles, however, can also be used because this construction works over a wide range of tilt angles. Although much of the assessment was carried out using COSMOS computer simulations, a physical prototype without an operating ionic air-mover was constructed and tested, and the observed results were found to agree closely with the results of the simulation.

FIG. 1B shows a perspective cutaway view from below of the same LED downlight 100 shown in FIG. 1A, also showing output light beam 140 (represented by arrows diverging downward) issuing from the aperture of can 101. FIG. 1C is a similar view from further below, showing LEDs 202 and beam-shaping reflectors 203.

Figure 2:
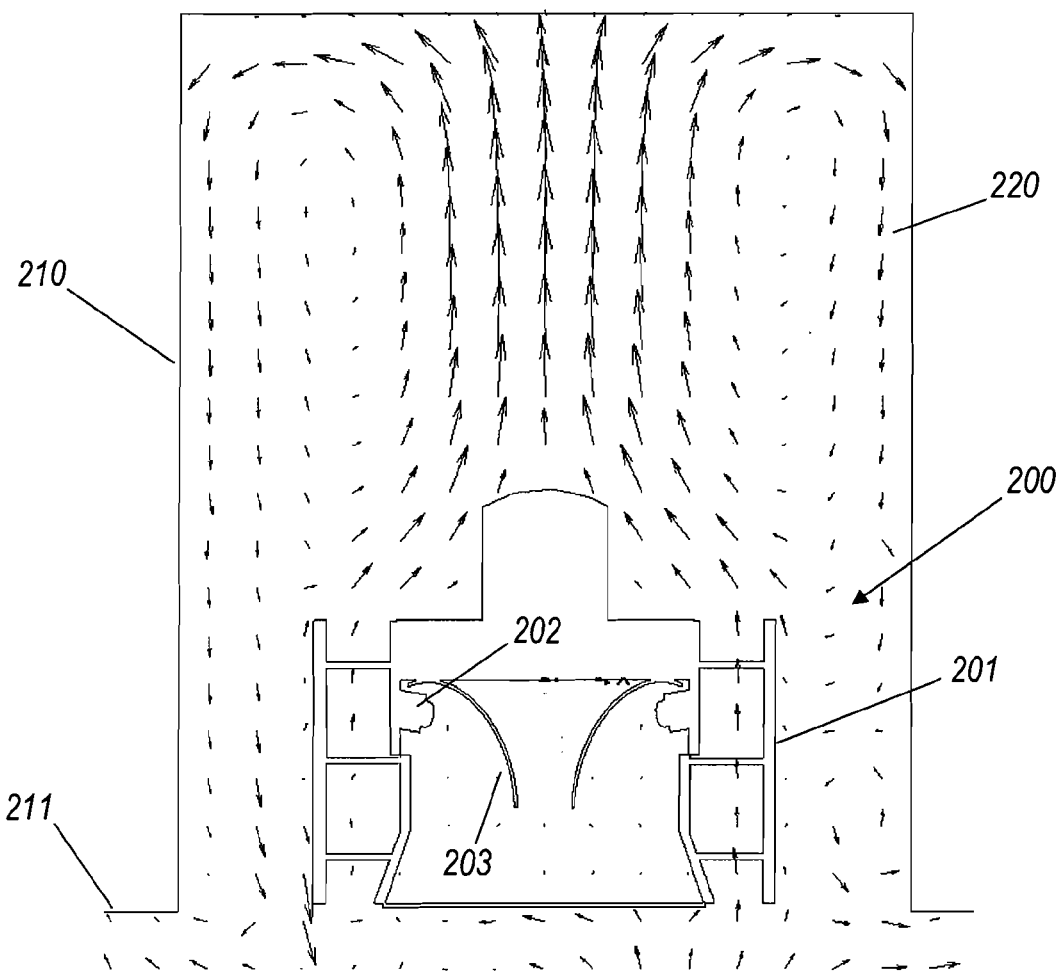
FIG. 2 is a cross-section of a heat sink in can similar to that of FIGS. 1A to 1C with air-velocity arrows showing natural convection.

FIG. 2 is a cross-sectional view of a 10 Watt LED downlight 200, comprising helical heat sink 201, LEDs 202, and mirrors 203. The downlight is installed in can 210 mounted in ceiling 211. Air velocity arrows 220 delineate the field of velocity vectors within the can for the case when a vertical chimney effect is occurring and the ion propulsion system is turned off. The direction of each arrow 220 shows the direction of air flow and the length of the arrow is proportional to the speed of the air flow. The largest arrows at the center indicate velocities of 120 mm/second. A plan view would show that the velocity vectors are orientated in a spiral pattern as expected. The simulation assumed no heat losses through the can wall.

The downlight of FIG. 2 is based on the design revealed in U.S. patent application Ser. No. 12/456,392 titled "Multi-Reflector Cylindrical Light Source with Interior LEDs and Exterior Heat Sink", which is incorporated herein by reference in its entirety. This design provides for the location of the LEDs on the exterior walls of a hollow cylinder which can be made of metal or some other conductive material making it suitable for use with the thermal management system described in this application.

FIG. 3 shows a perspective view of a helical heat sink 300 suitable for use with an LED light bulb, comprising helical vanes 303, and outer sleeve 304 with air passages 305. Also in FIG. 3 are central optical can 301, power supply and LED module 302. The screw-in base or other standard connector for the light bulb is not shown but would attach to the base of component 302. As may be seen from FIG. 3, when mounted vertically the heat sink 300 functions similarly to the heat sink 101, 103, 104 shown in FIGS. 1 and 2. When mounted at other orientations, the air passages 305 in the outer sleeve 304, together with the gaps between the helical vanes 303, permit air to flow in directions with a circumferential or tangential component. At any orientation, the vanes 303 impart the desired helical motion to an upward convective flow among the vanes. At all orientations this design can maintain its thermal superiority over conventional straight fins. Air passages 305 are shown as rectangular openings but other shapes such as circles, ellipses, etc. can also be used.

Figure 4:
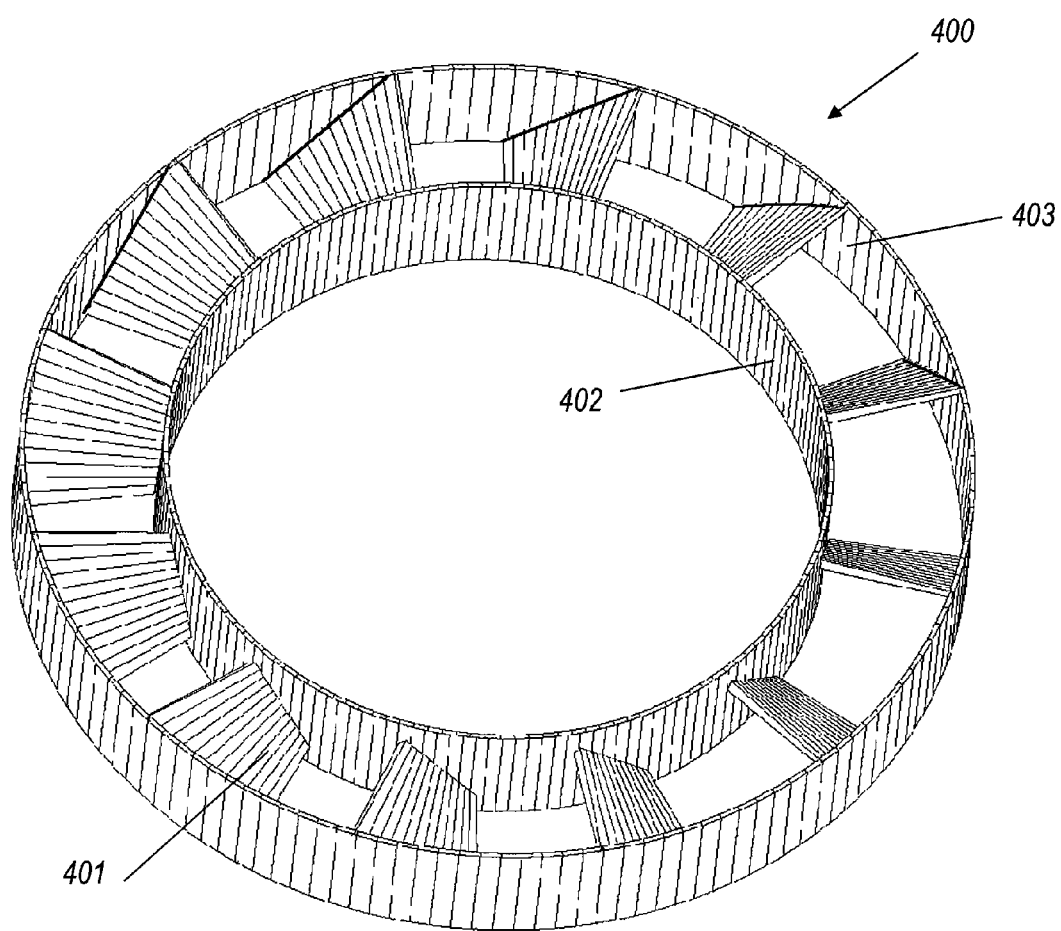
FIG. 4 shows a metal injection-moldable or castable fin assembly that may form part of the heat sinks shown in FIGS. 1 and 3.

FIG. 4 shows a perspective view of injection-moldable or castable fin assembly 400, comprising a single tier of fins 401, inner sleeve 402, and outer sleeve 403. Three such assemblies can be combined to form the vanes 103 of FIG. 1A. Inner sleeve 402 can have alignment features that allow it to slide onto a central cylindrical body such as the optical can 101 of FIG. 1A. The outer surface of central cylindrical body (such as optical can 101 of FIG. 1A), can have alignment features that mate with those of inner sleeve 402. The mating system can be designed such that one fin-assembly can be stacked on to the next with the proper angular rotational shift. Alternatively, each molded or cast fin-assembly can have mating features that align and attach it to its neighbor/s in the correct vertical position and rotational orientation.

The heat sink assembly 300 of FIG. 3 can be assembled using fin assemblies 400 similar to those shown in FIG. 4. However, the middle fin assembly would then have gaps in the outer sleeve 403 to form the openings 305.

Figure 5A:
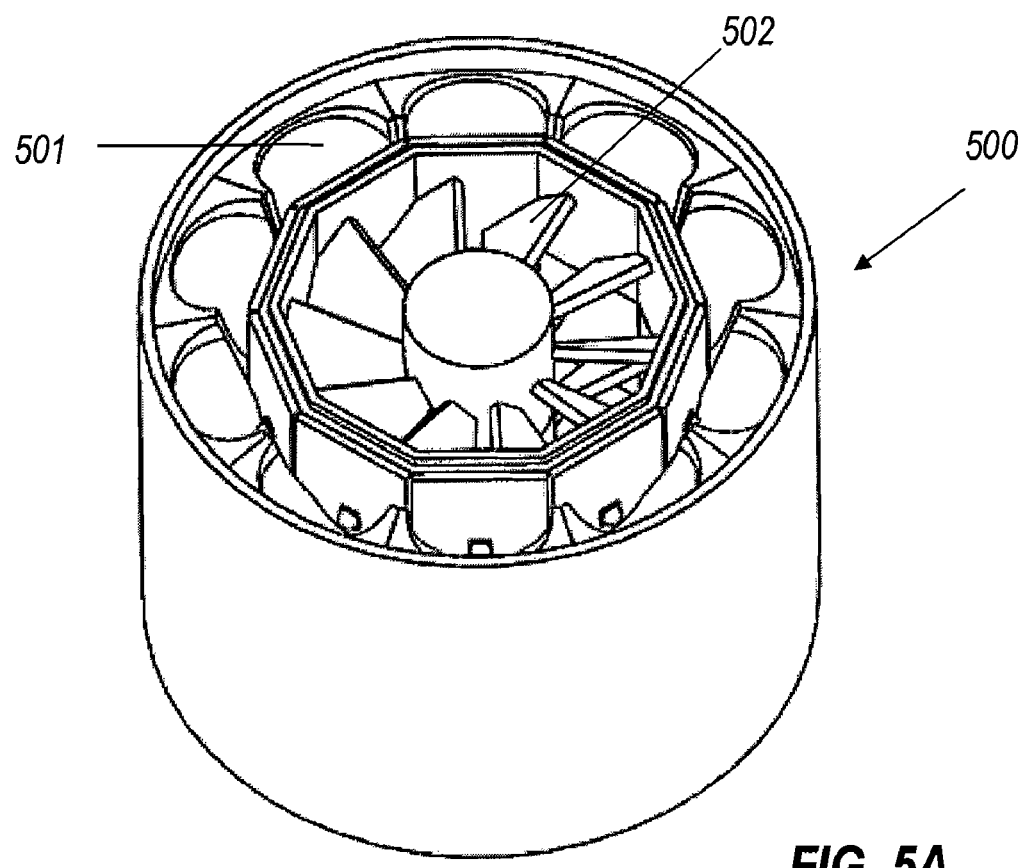
FIG. 5A shows a preferred embodiment of a downlight with a helical heat sink which resides internal to the ten-fold reflector optic of PCT/U.S. 09/03593 and US 2009-0323338.
Figure 5B:
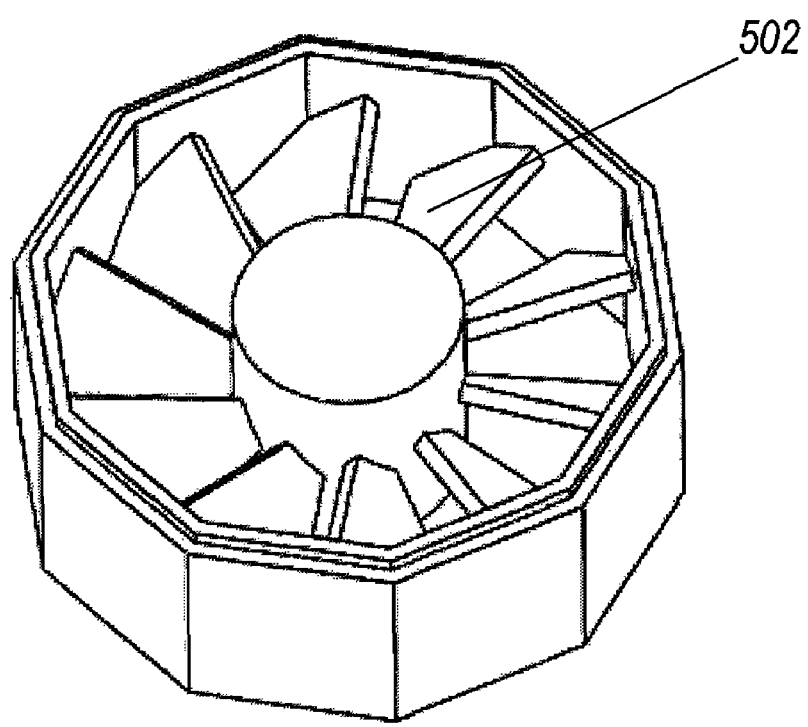
FIG. 5B shows one of three stacked heat sinks of the downlight of FIG. 5A.

FIGS. 5A and 5B, collectively referred to as FIG. 5, show a preferred embodiment for a helical heat sink for a downlight 500 based on the optical architecture of FIG. 12 and FIG. 20 of US 2009-0323338 and PCT/U.S. Ser. No. 09/03593. In this approach the helical heat sinks 502 are located interior to the 10-fold reflectors 501. The inner sleeve, corresponding to sleeve 101 in FIG. 1, is formed by an external wall of a central core, which may be solid, or at least completely enclosed by solid walls. In this design it was found that three helical sinks stacked on top of each other were optimum. One of the three heat sinks 502 is shown in FIG. 5B. The inventors completed a prototype of downlight 500 and performed tests on it. The system performed exactly as predicted by the COSMOS simulation. The system did not in this case require electrostatic augmentation even in an insulated can, as the junction temperature of the white LEDs (108° C. with 16.5 Watts) was within the operating temperature recommended by the LED manufacturer, CREE, for their XPE LEDs. This was a very good result considering that the total power to the downlight was 16.5 W. In a non-insulated can the LED junction temperature was approximately 65° C. The simulations and actual measurement of temperature for a number of locations (heat sink, LED junction) were within a couple of ° C. of each other.

In the luminaire shown in FIG. 5A, it may be seen that there is dead space between the polygonal inner shroud and the circular outer shroud behind (above when positioned as a downlight) the reflectors 501. That space may be used for power and LED driver circuitry and other auxiliary components.

If an electrostatic drive 120, 125 is desired in the luminaire of FIG. 5, it may be provided outside the outer can shown in FIG. 5, and an insulating shroud 126 may be provided outside the electrodes.

The materials used in the aforementioned embodiments need to conduct heat generated from the LEDs and power supply to the helical heat sink efficiently. A suitable metal is aluminum. Other approaches can be used, such as heat pipes. It should be apparent to one skilled in the art how to incorporate thermal vias into the components of the downlight of FIG. 1A and LED light bulb of FIG. 3.

The preceding description of the presently contemplated best mode of practicing the invention is not to be taken in a limiting sense, but is made merely for the purpose of describing general principles.

Although distinct embodiments have been described, the person skilled in the art will understand how features of the different embodiments may be combined. For example, the embodiment of FIG. 5 has a polygonal outer sleeve, with a flat facet facing, and acting as a reflector for, each of the LED light sources 501. The embodiment of FIG. 1 has a circular inner sleeve, with part of the curved surface facing, and acting as a reflector for, each of the LED light sources 501. The choice in any position in any embodiment of a sleeve that is cylindrical in the colloquial sense of a right circular cylinder or only in the broader mathematical sense, including a polygon or other appropriate shape, may be based on the desired optical geometry, on the aesthetics of the luminaire, or on other considerations.

In the described embodiments, the first or upper electrode 120 is the cathode, producing a negatively charged corona, and the second or lower electrode 125 is the anode. That configuration is presently preferred, but the upper electrode may instead be the anode, producing a positive discharge.

Although the vanes or fins 103, 303, 403 are described as "helical," each individual vane may be of a simpler shape. For example, each individual vane may be flat, or may be defined by flat chords with the angle of the chords decreasing with increasing radius. The vanes are then tilted so as to lie generally on a helix. Where, as shown in FIGS. 1 and 3, several vanes are positioned in a row end to end to define a convection path, the rows, and the paths between them, may be generally helical even if the individual vanes are not helical.

As may be seen from a comparison of FIG. 4 with FIGS. 1 and 3, the inner sleeve 401 of FIG. 4 may be the wall of the optical can, or may be a separate component fitting over the optical can. The element numbered 101, 301 may represent either of those constructions. A construction with a separate sleeve may be easier to fabricate, but may use more material, and care may be called for to ensure a good thermal contact between the can and the sleeve.

The full scope of the invention should be determined with reference to the Claims.

We claim:

1. A lamp comprising:
   a heat sink comprising an inner sleeve, an outer sleeve spaced from said inner sleeve, multiple tilted fins connecting, said inner sleeve with said outer sleeve, said fins aligned to form helical passages for rising fluid heated by said fins;
   a light source arranged in operation to project light through a first axial end of the inner sleeve, which light source in operation produces heat, said heat sink surrounding and in thermal communication with said light source; and
   ceiling can surrounding and spaced from the heat sink, with the first end of the heat sink facing the open end of the can.

2. The lamp of claim 1, wherein the heat sink further comprises gaps in said tilted fins permitting air flow between adjacent ones of said helical passages.

3. The lamp of claim 1, wherein the heat sink also comprises air passages through said outer sleeve, aligned with the passages between said fins.

4. A lamp according to claim 1 wherein said light source is an annular light source comprising, a plurality of light sources evenly spaced around the circumference of the inner sleeve arranged in operation to project light past a first axial end of the inner sleeve, which light sources in operation produce heat.

5. A lamp according to claim 1, wherein said heat sink has an axial direction and said fins are tilted relative to said axial direction over their entire area and are aligned to form helical passages open at both axial ends of the heat sink for rising fluid heated by said fins.

6. A lamp comprising a heat sink comprising an inner sleeve, an outer sleeve spaced from said inner sleeve, and multiple tilted fins connecting said inner sleeve with said outer sleeve, said fins aligned to form helical passages for rising fluid heated by said fins; said heat sink surrounded by and in thermal communication with an annular light source arranged in operation to project light past a first axial end of the inner sleeve, which light source in operation produces heat.

7. The lamp of claim 6, wherein the annular light source comprises a plurality of light sources evenly spaced around the circumference of the outer sleeve.

8. A heat sink comprising an inner sleeve; an outer sleeve coaxial with and spaced apart from the inner sleeve and having first and second axial ends; multiple fins connecting said inner sleeve with said outer sleeve, said fins forming passages between the ends of said sleeves, an annular emitting wire electrode surrounding said heat sink and insulated therefrom, stud emitting wire electrode of diameter less than 0.1 mm; at least one collector electrode of opposite polarity from said emitting electrode, said at least one collector electrode surrounding said heat sink between said emitting electrode and said second end; and a cylindrical outermost sleeve concentric with said inner and outer sleeves, said outermost sleeve surrounding said electrode.

9. The heat sink of claim 8, wherein said at least one collector electrode comprises a pair of parallel right circular cylindrical electrodes.

10. The heat sink of claim 9 wherein said collector electrodes are sections of cylinders coaxial with the inner and outer sleeves and spaced apart radially, allowing free axial passage of air between and around the collector electrodes.

11. The heat sink of claim 8 wherein the electrodes are a passage defined by an electrically insulating inner surface of said outermost sleeve and a facing electrically insulating outer surface.

12. The heat sink of claim 8, further comprising a power source that in operation supplies current to said first and second electrodes at a voltage sufficiently high to cause dielectric breakdown in air and induce air movement in the direction from said first electrode towards said at least one second electrode.

13. The heat sink of claim 12, wherein the first electrode is the cathode.

14. The heat sink of claim 8, arranged in use to be oriented vertically with the first end at the top.

15. The heat sink of claim 8, wherein the fins are tilted forming helical passages.

16. The heat sink of claim 15, wherein the fins are arranged in tiers offset axially, and fins in different tiers are aligned to form helices extending the axial length of the heat sink.

17. A lamp comprising a heat sink according to claim 8 in thermal communication with a light source arranged in operation to project light at the second end of the inner sleeve, which light source in operation produces heat.

18. The lamp of claim 17, farther comprising a ceiling can surrounding and spaced from the heat sink, with the second end of the heat sink facing the open end of the can, and said emitting and collector electrodes spaced apart with opposite polarity and connected to a high-voltage power supply, wherein in operation an electrostatic field between said electrodes induces movement of air in the space between the can and the heat sink in a direction from the first end towards the second end and thereby expels hot air from the can.

* * * * *